(12) United States Patent
Kim et al.

(10) Patent No.: US 12,422,458 B2
(45) Date of Patent: Sep. 23, 2025

(54) ELECTRONIC SEAL DEVICE FOR ELECTRONIC METER AND SMART ELECTRONIC SEAL SYSTEM INCLUDING THE SAME

(71) Applicant: YMS TECH CO., LTD., Anyang-si (KR)

(72) Inventors: Yong Jun Kim, Seongnam-si (KR); Moon Su Choi, Namyangju-si (KR)

(73) Assignee: YMS TECH CO., LTD., Anyang-si (KR)

( * ) Notice: Subject to any disclaimer, the term of this patent is extended or adjusted under 35 U.S.C. 154(b) by 0 days.

(21) Appl. No.: 18/284,501

(22) PCT Filed: Sep. 25, 2023

(86) PCT No.: PCT/KR2023/014587
§ 371 (c)(1),
(2) Date: Sep. 27, 2023

(87) PCT Pub. No.: WO2025/063349
PCT Pub. Date: Mar. 27, 2025

(65) Prior Publication Data
US 2025/0093389 A1    Mar. 20, 2025

(30) Foreign Application Priority Data
Sep. 18, 2023  (KR) .................. 10-2023-0123644

(51) Int. Cl.
*G01R 11/04*  (2006.01)
*H05K 5/06*  (2006.01)

(52) U.S. Cl.
CPC ............. *G01R 11/04* (2013.01); *H05K 5/069* (2013.01)

(58) Field of Classification Search
CPC .................. G01R 11/04; H05K 5/069
(Continued)

(56) References Cited

U.S. PATENT DOCUMENTS

2003/0189491 A1* 10/2003 Ng .................. G06K 19/04
340/568.1
2009/0066503 A1* 3/2009 Lin .................. G08B 21/0269
340/568.1
(Continued)

FOREIGN PATENT DOCUMENTS

CN       113424189 A    9/2021
JP       2002-257862 A  9/2002
(Continued)

OTHER PUBLICATIONS

Communications of Korean Office Action dated Feb. 6, 2025 of Korean Patent Application No. 10-2023-0123644, which corresponds to this application.

*Primary Examiner* — Zhengfu J Feng
(74) *Attorney, Agent, or Firm* — Goldilocks Zone IP Law

(57) ABSTRACT

Disclosed is the electronic seal device comprising a seal bolt unit for electronic sealing; and a seal fastening unit coupled to the seal bolt unit using a screw thread. Wherein the seal bolt unit comprises a seal open/close unit coupled to the seal fastening unit using the screw thread; a seal communication unit located inside the upper part of the seal open/close unit; and a sealed antenna unit located inside the lower part of the seal open/close unit. Wherein the seal antenna unit comprises a first conductor part connected to the seal communication unit; a first contact part connected to the first conductor part; a second conductor part connected to a seal battery unit; a second contact part connected to the second conductor part; and an insulating part located between the first contact part and the second contact part.

15 Claims, 15 Drawing Sheets

(58) Field of Classification Search
USPC .......................................................... 361/659
See application file for complete search history.

(56) References Cited

U.S. PATENT DOCUMENTS

| | | | |
|---|---|---|---|
| 2009/0108596 A1* | 4/2009 | Terry | G09F 3/0317 |
| | | | 292/327 |
| 2011/0193678 A1* | 8/2011 | Hanft | G01R 11/25 |
| | | | 70/57.1 |
| 2012/0119975 A1 | 5/2012 | Lee et al. | |
| 2017/0032710 A1* | 2/2017 | Debrody | G09F 3/0376 |

FOREIGN PATENT DOCUMENTS

| | | | | |
|---|---|---|---|---|
| KR | 102019603 B1 * | 9/2019 | | G09F 3/03 |
| WO | 2020136628 A1 | 7/2020 | | |

* cited by examiner

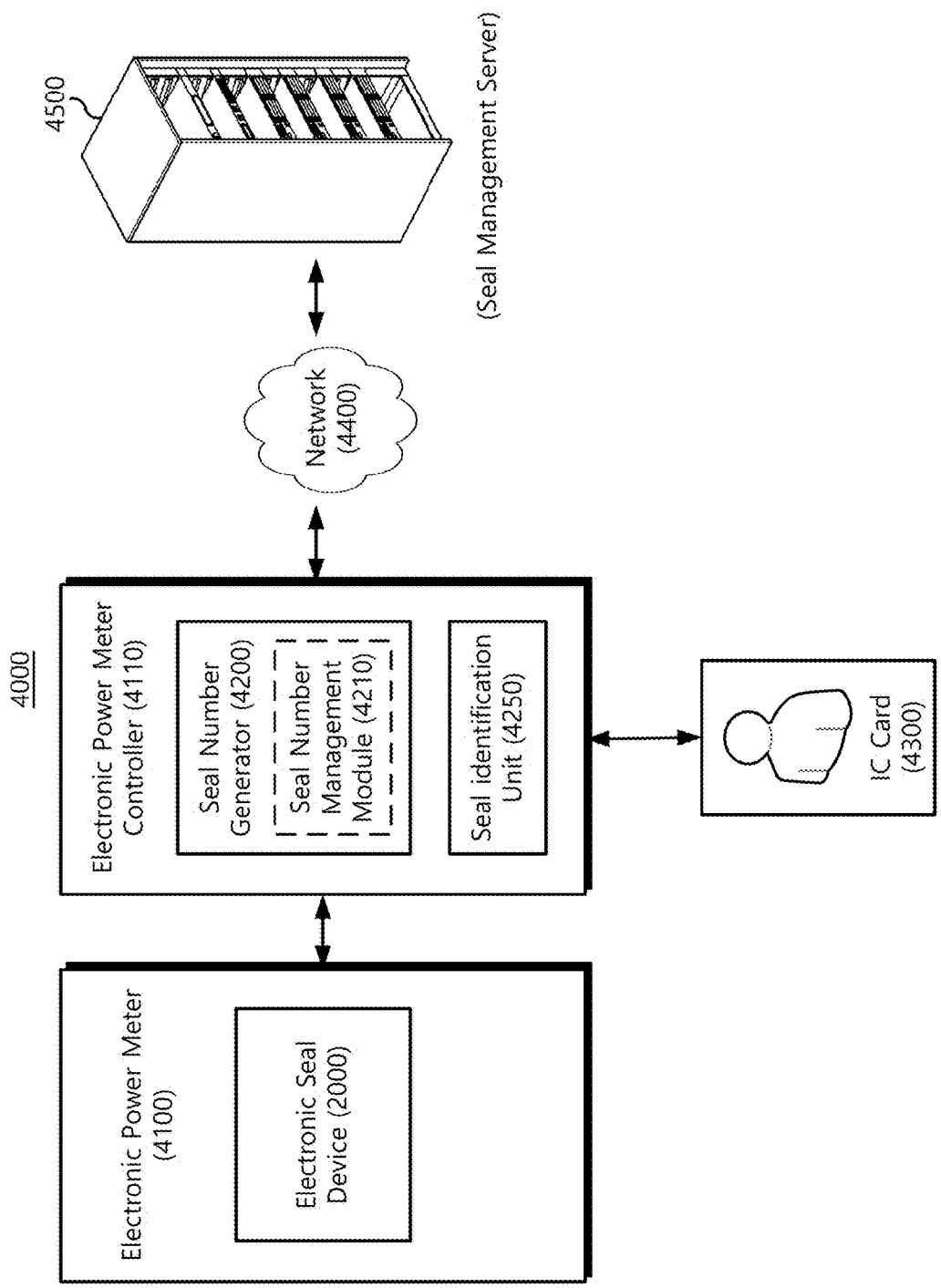

ELECTRONIC SEAL DEVICE FOR ELECTRONIC METER AND SMART ELECTRONIC SEAL SYSTEM INCLUDING THE SAME

CROSS-REFERENCE TO RELATED APPLICATIONS

This application claims the benefit under 35 U.S.C. section 371, of PCT International Application No. PCT/KR2023/014587, filed on Sep. 25, 2023, which claims priority to Korean Patent Application No. 10-2023-0123644, filed on Sep. 18, 2023, in the Korean Intellectual Property Office, both of which are hereby incorporated by reference in their entireties.

TECHNICAL FIELD

The present disclosure relates to an electronic seal system, and more particularly, to an electronic seal device for an electronic meter and a smart electronic seal system including the same.

BACKGROUND ART

Heat energy may be supplied using electricity, gas, water, etc. in various places such as general houses, commercial buildings, and industrial sites. Meters such as electronic power meters, gas flow meters, water flow meters, and calorimeters may be installed to measure the amount of heat energy used at each location. Each meter may display metering information such as usage status and usage amount through a metering indicator so that suppliers and users may know. Additionally, each meter may be sealed using a separate device to prevent manipulation of metering information.

Previously, lead was used to seal electronic power meters for over 100 years. Because lead pollutes the environment and is harmful to the human body, the seal material was changed to plastic. The plastic seal may cover the power meter terminal cover and the space that houses the modem. The plastic seal has a seal number written on it, and the seal number may be entered into the computer and managed.

However, plastic seals have low work efficiency during sealing work because seal numbers are managed manually. Plastic seals have low measurement reliability. Plastic seals may cause environmental pollution due to carbon emissions during the disposal process. Because plastic seals must be checked individually for damage, action against damage to the electricity meter may be delayed.

DISCLOSURE

Technical Problem

The purpose of the present disclosure is to provide an electronic seal device that reduces waste emissions due to seal damage and improves the sealing operation method by combining a communication device and a seal device, and an electronic sealing system including the electronic seal device.

Technical Solution

According to an embodiment, the electronic seal device comprises a seal bolt unit for electronic sealing; and a seal fastening unit coupled to the seal bolt unit using a screw thread. Wherein the seal bolt unit comprises a seal open/close unit coupled to the seal fastening unit using the screw thread; a seal communication unit located inside the upper part of the seal open/close unit; and a sealed antenna unit located inside the lower part of the seal open/close unit. Wherein the seal antenna unit comprises a first conductor part connected to the seal communication unit; a first contact part connected to the first conductor part; a second conductor part connected to a seal battery unit; a second contact part connected to the second conductor part; and an insulating part located between the first contact part and the second contact part. Wherein the first contact part and the second contact part are electrically connected when the seal fastening unit and the seal open/close unit are coupled.

According to an embodiment, the smart electronic seal system comprises an electronic power meter including an electronic seal device and an electronic power meter controller; and a seal number generator for providing a seal number to the electronic seal device. Wherein the electronic power meter controller receives a seal number from the seal number generator and controls the seal operation of the electronic seal device. Wherein the electronic seal device comprises a seal bolt unit for electronic sealing; and a seal fastening unit coupled to the seal bolt unit. Wherein the seal bolt unit comprises a seal open/close unit coupled to the seal fastening unit; a seal communication unit located inside the upper part of the seal open/close unit; and a seal antenna unit located inside the lower part of the seal open/close unit. Wherein the seal antenna unit comprises a first conductor part connected to the seal communication unit; a first contact part connected to the first conductor part; a second conductor part connected to a seal battery; a second contact part connected to the second conductor part; and an insulating part located between the first contact part and the second contact part. Wherein the first contact part and the second contact part are electrically connected when the seal fastening unit and the seal open/close unit are coupled.

According to an embodiment, the smart electronic seal system comprises an electronic power meter including an electronic seal device; and an electronic power meter controller configured to include a seal number generator for providing a seal number to the electronic seal device and control a seal operation of the electronic seal device. Wherein the electronic seal device comprises a seal bolt unit for electronic sealing; and a seal fastening unit coupled to the seal bolt unit. Wherein the seal bolt unit comprises a seal open/close unit coupled to the seal fastening unit; a seal communication unit located inside the upper part of the seal open/close unit; and a seal antenna unit located inside the lower part of the seal open/close unit. Wherein the seal antenna unit comprises a first conductor part connected to the seal communication unit; a first contact part connected to the first conductor part; a second conductor part connected to a seal battery; a second contact part connected to the second conductor part; and an insulating part located between the first contact part and the second contact part. Wherein the first contact part and the second contact part are electrically connected when the seal fastening unit and the seal open/close unit are coupled.

Advantageous Effects

According to the smart electronic seal system according to an embodiment of the present disclosure, by combining a communication device and an electronic seal device, the sealing operation method may be improved and waste emissions due to seal damage may be reduced.

DESCRIPTION OF DRAWINGS

FIG. 15 is a block diagram illustrating another example embodiment of a smart electronic seal system according to the present disclosure.

BEST MODE

Figure 3:
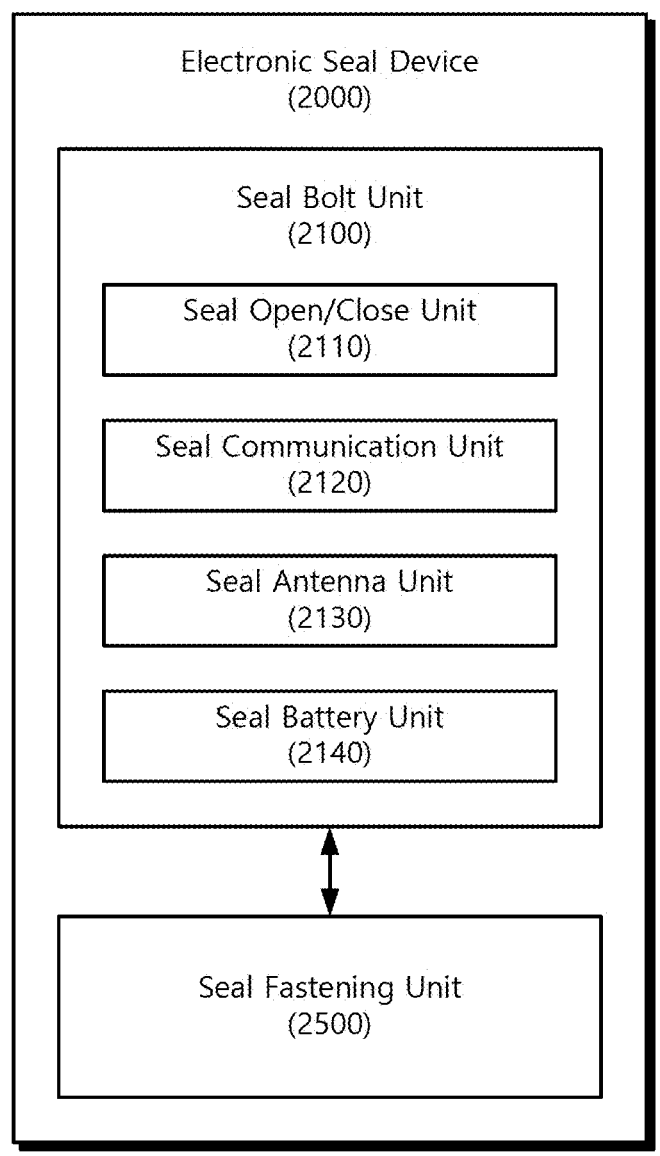
FIG. 3 is a block diagram illustrating an example embodiment of the electronic seal device shown in FIG. 1.

FIG. 3 illustrates the best mode for implementing the present disclosure.

MODE FOR INVENTION

Below, embodiments of the present disclosure will be described in detail and clearly to such an extent that an ordinary one in the art easily implements the invention.

Electronic power meters are being distributed to build a smart grid and lay the foundation for introducing real-time rate systems. Electronic power meters have a front cover that protects the internal board, etc., and a terminal cover and/or auxiliary cover that is sealed to prevent arbitrary manipulation, tampering, or deformation of the wire connection terminal part and communication port at the bottom of the instrument.

Figure 1:
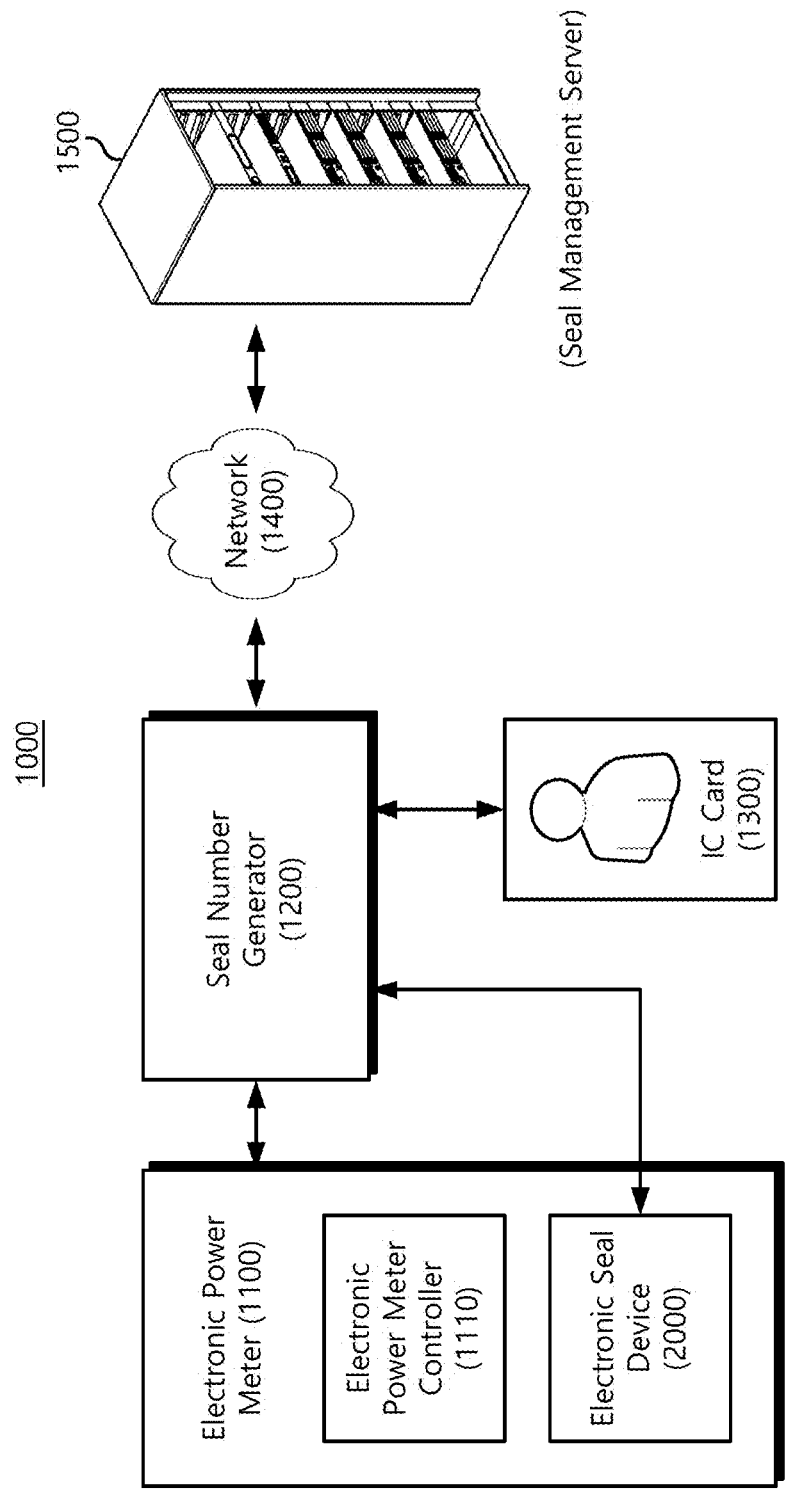
FIG. 1 is a block diagram illustrating an electronic seal system according to an embodiment of the present disclosure.
Figure 2:
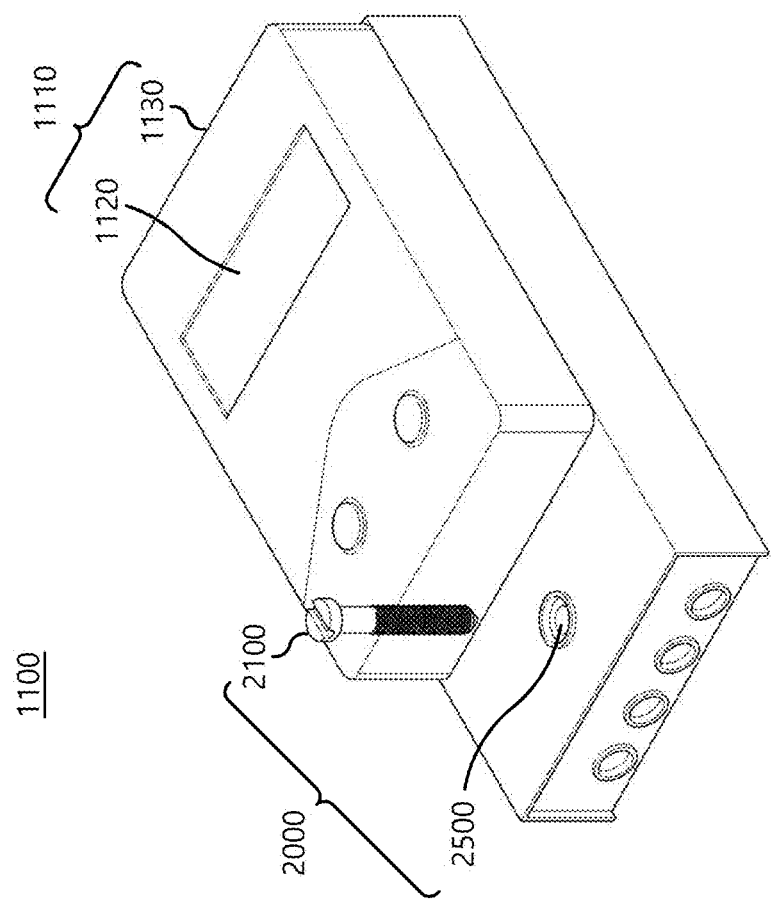
FIG. 2 is a three-dimensional view illustrating an example embodiment of the electronic power meter shown in FIG. 1.

FIG. 1 is a block diagram illustrating an electronic seal system according to an embodiment of the present disclosure. FIG. 2 is a three-dimensional view illustrating an example embodiment of the electronic power meter shown in FIG. 1. FIG. 3 is a block diagram illustrating an example embodiment of the electronic seal device shown in FIG. 1.

Referring to FIG. 1, the smart electronic seal system 1000 may include an electronic power meter 1100, a seal number generator 1200, an IC card 1300, a network 1400, and a seal management server 1500. The smart electronic seal system 1000 may provide information necessary for the use of power and prevent arbitrary manipulation.

The electronic power meter 1100 may be installed in places where electricity is used, such as general houses, commercial buildings, and industrial sites. The electronic power meter 1100 may be connected to a power line and may measure the amount of power consumed when supplied to a place where electricity is used. The electronic power meter 1100 may include the electronic power meter controller 1110 and an electronic seal device 2000.

The seal number generator 1200 may receive a request from the IC card 1300 or from the seal management server 1500 through the network 1400 and generate a seal number. The seal number may be provided to the electronic seal device 2000 of the electronic power meter 1100. Alternatively, the seal number generator 1200 may recognize the QR code using a built-in camera. The seal number generator 1200 may recognize the unique number of the electronic power meter 1100 from the QR code shown or displayed on the electronic power meter 1100.

The seal number generator 1200 may include an NFC communication module or an RFID communication module. The seal number generator 1200 may read the seal manager's unique information from the IC card 1300 using an NFC communication module or an RFID communication module. As an example, the seal number generator 1200 may include a Magnetic Secure Transmission (MST) module, a ZigBee module, a Z-Wave module, or an infrared module for short-range wireless communication.

The seal number generator 1200 may include a GPS module. The seal number generator 1200 may receive GPS information using the GPS module. The seal number generator 1200 may generate seal location information using the received GPS information. As an example, seal location information may include longitude information and latitude information.

The seal number generator 1200 may include an application for seal management tasks. The seal number generator 1200 may generate a seal number using an application. For example, the seal number may be a 7-digit unique number. The seal number may further include seal reference information. The sealing reference information may include the unique number of the electronic power meter 1100, the unique number of the seal manager, seal time information, seal type information, and seal location information.

For example, the unique number of the electronic power meter 1100 is numerical information determined during the production process, and only one number may be assigned to one electronic power meter 1100. As for the seal manager's unique number, one unique number may be assigned to one seal manager. The seal time information may include information about year, month, day, hour, minute and second (yyyymmddhhmiss). The seal type information may include seal state information. The seal state information may mean a seal open state or a seal close state. The seal location information may include longitude information and/or latitude information.

The seal number generator 1200 may transmit and receive data through the network 1400 using a built-in communication device. The built-in communication device may include a remote network interface such as a 3G module, LTE module, LTE-A module, Wi-Fi module, WiGig module, UWB (Ultra-Wide Band) module, or LAN card. The seal number generator 1200 may transmit the seal number to the electronic power meter 1100 or to the seal management server 1500 through the network 1400.

The IC card 1300 may be a card storing unique information of the seal manager. Here, the seal manager may mean a person who seals the electronic power meter 1100 at the actual site and manages the seal state of the electronic power meter 1100. The IC card 1300 may be an employee identification card carried by the seal manager. The IC card 1300 may include a short-range wireless communication module. The short-range wireless communication module may include an NFC communication module or an RFID communication module. The IC card 1300 may transmit the unique information of the seal manager through short-distance wireless communication.

The network 1400 may be a communication network that is a high-speed network capable of high-capacity, long-distance voice and data services. The network 1400 may be the Internet or a next-generation wired or wireless network for providing high-speed multimedia services. If the network 1400 is a mobile communication network, it may be a synchronous mobile communication network or an asynchronous mobile communication network.

An example of an asynchronous mobile communication network may be a Wideband Code Division Multiple Access (WCDMA) type communication network. Although not shown in the drawing, the network 1400 may include a Radio Network Controller (RNC). Although a WCDMA network is used as an example, the network 1400 may be a 3G LTE network, a 4G network, a next-generation communication network such as 5G, or another IP network.

The seal management server 1500 may register and manage the unique number of the seal manager. The seal management server 1500 may receive, store, and manage the seal number from the seal number generator 1200. The seal management server 1500 may interpret the seal number and manage the unique number of the electronic power meter 1100, the unique number of the seal manager, seal time information, seal type information, and/or seal location information.

The seal management server 1500 may provide a seal number management service. The seal management server 1500 may provide a dedicated application for providing a seal number management service or a web page that may access the seal number management service. The seal management server 1500 may store and manage the unique number of the seal manager and/or seal number of the seal number generator 1200.

Referring to FIG. 2, the electronic power meter 1100 may display an electronic power meter unique number on the outside. the electronic power meter 1100 may display a QR code on the outside. The QR code may include a unique number of the electronic power meter 1100. As an example, the QR code may be attached to a pre-printed sticker or engraved using a separate device.

The electronic power meter controller 1110 may include a seal display unit 1120 and a seal control unit 1130. The seal control unit 1130 may determine the state of the electronic power meter 1100 and generate a power meter state information. As an example, the power meter state information may include total power consumption, power consumption by time zone, piece time, active power, reactive power, regular load active power, late-night load active power, and current time information.

The seal display unit 1120 may display the power meter state information generated by the seal control unit 1130. As an example, the power meter state information may include the power meter seal number and/or power meter open/close information.

The seal control unit 1130 may receive a seal number from the seal number generator 1200 to manage the electronic power meter 1100 and generate a power meter seal number. As an example, the power meter seal number may be a management number assigned to each power meter 1100 that has been sealed. The seal number may exist in the form of a label with a specific character string printed on it, and may be stored in electronic form.

The seal control unit 1130 may determine whether the seal is open state or close state, and generate power meter seal information. As an example, the power meter open/close information described later may generate seal completion information when the seal is completed, and may generate seal release information when the seal is broken. Additionally, seal time information and seal break time information may be generated.

Referring to FIG. 3, the electronic seal device 2000 may include a seal bolt unit 2100 and a seal fastening unit 2500. The seal bolt unit 2100 may be coupled to the seal fastening unit 2500 using threads. The seal bolt unit 2100 may include a seal open/close unit 2110, a seal communication unit 2120, and a seal antenna unit 2130. The seal bolt unit 2100 may include threads corresponding to the seal fastening unit 2500 on the outside of the electronic power meter 1100. The seal bolt unit 2100 may be combined with the seal fastening unit 2500 to seal the electronic power meter 1100.

The electronic seal device 2000 may further include a seal battery unit 2140. The seal battery unit 2140 may supply power to the seal communication unit 2120 and/or the seal antenna unit 2130. In FIG. 3, the seal battery unit 2140 is shown as being located within the seal bolt unit 2100, but the seal battery unit 2140 may be located outside the seal bolt unit 2100.

The electronic seal device 2000 may be broken to be separated from the seal fastening unit 2500. Accordingly, the electronic seal device 2000 may prevent manipulation of the electronic power meter 1100. When the electronic seal device 2000 is separated, the seal control unit 1130 may generate seal breaking information, and the seal display unit 1120 may display the seal breaking information. When the electronic seal device 2000 may be combined with the seal fastening unit 2500, it may transmit or receive data with the seal control unit 1130 through the seal fastening unit 2500.

Figure 4:
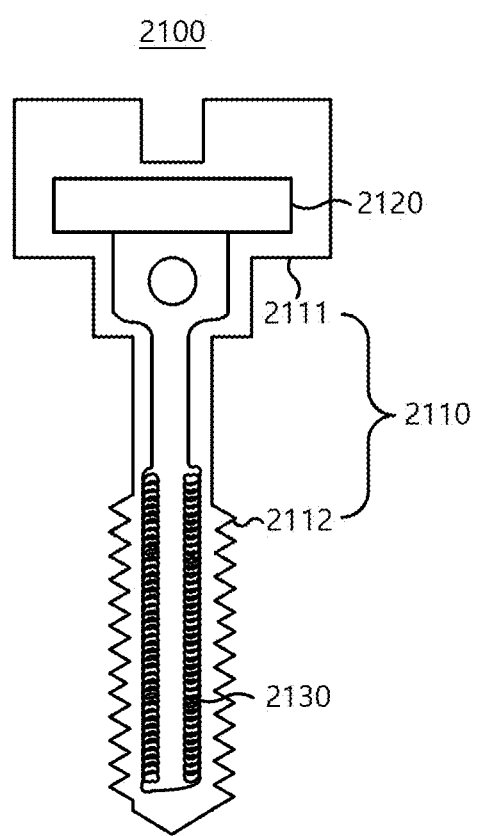
FIG. 4 is a conceptual diagram illustrating the seal bolt unit shown in FIG. 3.

FIG. 4 is a conceptual diagram illustrating the seal bolt unit shown in FIG. 3. Referring to FIG. 4, the seal bolt unit 2100 may include a seal open/close unit 2110, a seal communication unit 2120, and a seal antenna unit 2130.

The seal open/close unit 2110 may be coupled to the seal fastening unit 2500 and may be separated from the seal fastening unit 2500. The seal open/close unit 2110 may be combined with the seal fastening unit 2500 to seal the electronic power meter 1100. The seal open/close unit 2110 may be separated from the seal fastening unit 2500 to release the seal.

The seal open/close unit 2110 may be made of metal, plastic, or a mixture of these. As an example, the plastic material may include glass fiber reinforced plastics (GFRP) or epoxy resin. The seal open/close unit 2110 may be manufactured according to the screw standard corresponding to the seal fastening unit 2500. As an example, the screw standard may be number 5, which is 4 mm in size among the cover seal sleeve dimensions specified in KS C B 1208. In addition, the screw standard may be the same as the previously used seal bolt screw standard.

The seal open/close unit 2110 may include a bolt head part 2111 and a bolt thread part 2112. The bolt head part 2111 may be located at the top of the seal open/close unit 2110 and may have a cylindrical shape. The bolt head part 2111 may include free space therein. The bolt head part 2111 may include a driver groove at the top. As an example, the driver groove may include a '−' or '+' shape. The bolt head part 2111 may receive rotational force from a tool such as a driver.

The bolt thread part 2112 may be located below the seal open/close unit 2110 and may have the same rotation axis as the bolt head part 2111. As an example, the bolt thread part 2112 may include threads on the outside. The bolt thread part 2112 may receive rotational force from the bolt head part 2111 and be coupled to the seal fastening unit 2500.

The bolt thread part 2112 may be hollow on the inside in a cylindrical shape. The bolt thread part 2112 may be electrically conductive by contacting the seal fastening unit 2500. When the bolt thread part 2112 is in contact with the seal fastening unit 2500 and conducts electricity, the seal control unit 1130 may detect the conduction. The bolt thread part 2112 may transmit data when the seal control unit 1130 detects conduction.

The seal communication unit 2120 may be located inside the bolt head part 2111. The seal communication unit 2120 may be built or inserted into the spare space of the bolt head part 2111. The seal communication unit 2120 may provide wireless communication. As an example, wireless communication may include RFID, Bluetooth, NFC, ZIGBEE, and WiFi communication methods. The seal communication unit 2120 may provide power meter management information such as power meter state information, power meter seal number, and power meter open/close information through wireless communication.

The seal antenna unit 2130 may be formed inside the bolt thread part 2112. The seal antenna unit 2130 may be inserted into the bolt thread part 2112 and may be integrally coupled with each other. The seal antenna unit 2130 may be connected to the seal communication unit 2120 and may transmit data generated by the seal communication unit 2120 in the form of radio waves. The seal antenna unit 2130 may receive external radio signals.

The seal antenna unit 2130 may transmit and receive wireless communication waves such as RFID, Bluetooth, NFC, ZIGBEE, and WiFi. The seal antenna unit 2130 may be made of a metal material that conducts electricity. As an example, the metal material may include gold, silver, copper, aluminum, or steel. The seal antenna unit 2130 may be in a stretched form like a string or in the form of a coil.

The seal battery unit 2140 may store a small amount of power. The seal battery unit 2140 may be connected to the seal communication unit 2120 and/or the seal antenna unit 2130. The seal battery unit 2140 may be connected to the seal antenna unit 2130 with a (+) pole and the seal communication unit 2120 with a (−) pole. The seal battery unit 2140 may be connected to the seal antenna unit 2130 with a (−) pole and the seal communication unit 2120 with a (+) pole. The seal battery unit 2140 may supply power to the seal communication unit 2120 and/or the seal antenna unit 2130.

When the seal open/close unit 2110 may be combined with the seal fastening unit 2500 to seal the electronic power meter 1100, the seal control unit 1130 may generate a power meter seal number. The seal control unit 1130 may transmit power meter seal number information to the seal communication unit 2120 through the seal open/close unit 2110. The seal communication unit 2120 may generate a wireless communication signal and transmit it to the outside through the seal antenna unit 2130. The seal fastening unit 2500 may seal the electronic power meter 1100.

The Seal may be joined in the usual way, but separation may require a separate process. As an example, the seal fastening unit 2500 may include a screw thread to seal the electronic power meter 1100. The seal fastening unit 2500 may further include a component for transmitting and receiving data. As an example, the seal fastening unit 2500 may exchange data with the seal control unit 1130.

Figure 5:
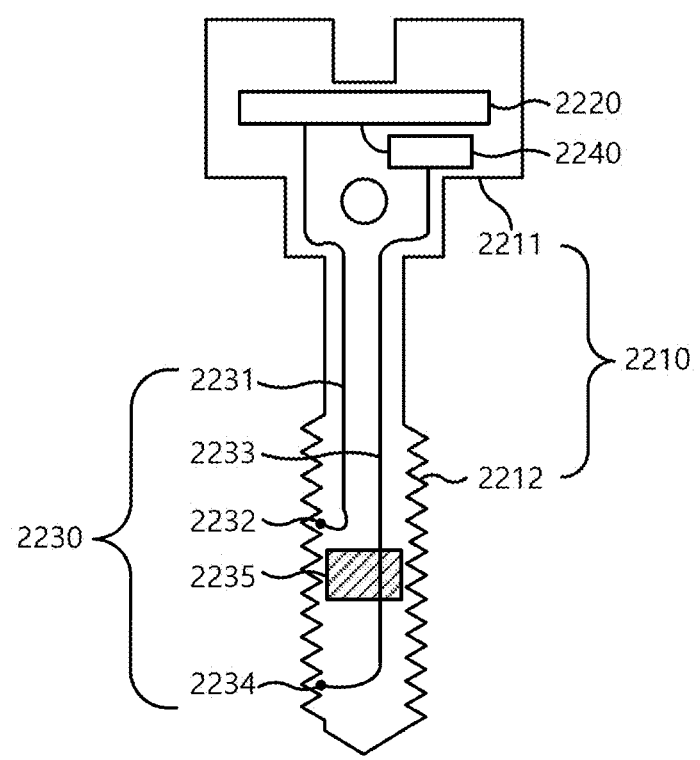
FIG. 5 is a conceptual diagram illustrating another example embodiment of the seal bolt unit shown in FIG. 4.

FIG. 5 is a conceptual diagram illustrating another example embodiment of the seal bolt unit shown in FIG. 4. Referring to FIGS. 3 and 5, the seal bolt unit 2200 may include a seal open/close unit 2210, a seal communication unit 2220, a seal antenna unit 2230, and a seal battery unit 2240.

The seal open/close unit 2210 may be coupled to the seal fastening unit 2500 and may be separated from the seal fastening unit 2500. The seal open/close unit 2210 may include a bolt head part 2211 and a bolt thread part 2212. The seal communication unit 2220 may be located inside the bolt head part 2211. The seal communication unit 2220 may be built or inserted into the spare space of the bolt head part 2211.

The seal antenna unit 2230 may be formed inside the bolt thread part 2212. The seal antenna unit 2230 may be built or inserted into the bolt thread part 2212 and integrally coupled with each other. The seal antenna unit 2230 may be connected to the seal communication unit 2220. The seal antenna unit 2230 may be in a stretched form like a string or in the form of a coil. The seal antenna unit 2230 may include a first conductor part 2231, a first contact part 2232, a second conductor part 2233, a second contact part 2234, and an insulating part 2235.

The first conductor part 2231 may be connected to the seal communication unit 2220. The first conductor part 2231 may be arranged in the form of a string or coil along the inside of the bolt thread part 2212. The first contact part 2232 may be connected to the first conductor part 2231 and may be exposed to the outside through the bolt thread part 2212.

The second conductor part 2233 may be connected to the seal battery unit 2240. The second conductor part may be arranged in the form of a string or coil along the inside of the bolt thread part 2212. The second contact part 2234 may be connected to the second conductor part 2233 and may be exposed to the outside through the bolt thread part 2212.

The insulating part 2235 may use an insulating material that blocks the transmission of electricity. The insulating part 2235 may be located between the first contact part 2232 and the second contact part 2234. The insulating part 2235 may block the flow of electricity when the first contact part 2232 and the second contact part 2234 are not in contact with the seal fastening unit 2500.

When the seal open/close unit 2210 and the seal fastening unit 2500 are coupled, the first contact part 2232 and the second contact part 2234 may be electrically connected to form a closed circuit.

The seal battery unit 2240 may be located inside the bolt head part 2211. The seal battery unit 2240 may be built or inserted into the spare space of the bolt head part 2211. The seal battery unit 2240 may store a small amount of power. The seal battery unit 2240 may be connected to the seal antenna unit 2230 and/or the seal communication unit 2200. The seal battery unit 2240 may supply power to the seal communication unit 2220 and/or the seal antenna unit 2230.

When the seal open/close unit 2210 and the seal fastening unit 2500 are coupled, the first contact part 2232 and the second contact part 2234 may be connected to the seal fastening unit 2500. When the first contact part 2232 and the second contact part 2234 are connected to the seal fastening unit 2500, a closed circuit in which the seal communication unit 3200, the seal antenna unit 2230, and the seal battery unit 2240 are connected may be formed.

When a closed circuit is formed, the seal battery unit 2240 may supply power to the seal communication unit 2200 and/or the seal antenna unit 2230. When power is supplied to the seal communication unit 2220 and/or the seal antenna unit 2230, the seal communication unit 2220 and/or the seal antenna unit 2230 may be recognized by a device capable of wireless communication.

The seal bolt unit 2200 may form a closed circuit at the same time as sealing. Accordingly, the seal bolt unit 2200 may store power in the seal battery unit 2240 before being sealed. The seal bolt unit 2200 may supply power when sealing is completed. The seal bolt unit 2200 may be recognized by a device capable of wireless communication.

Figure 6:
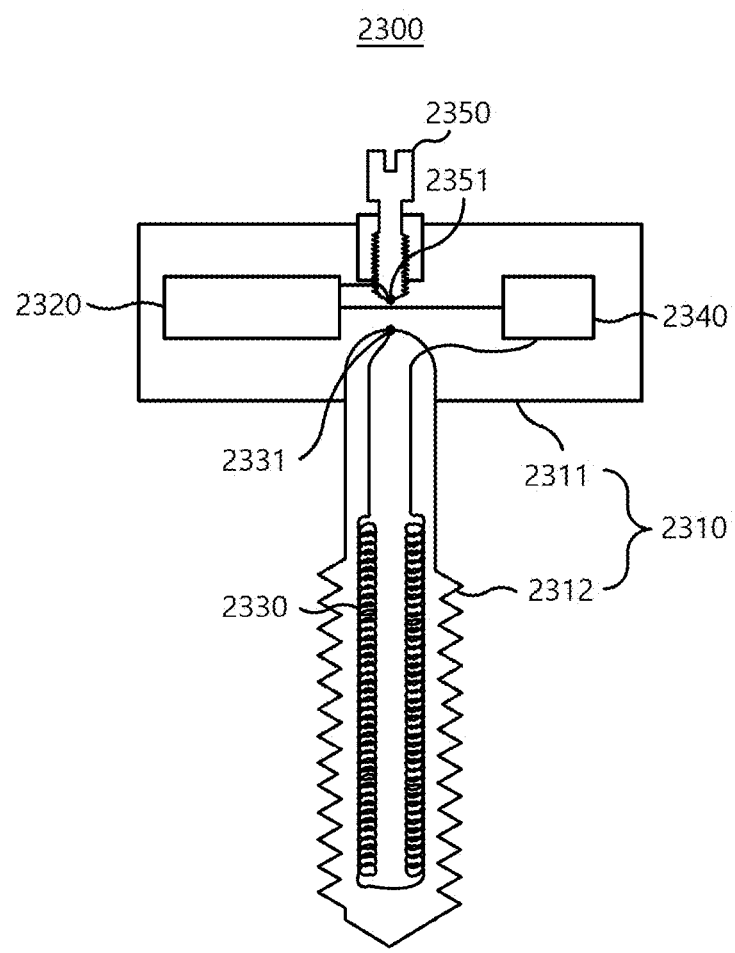
FIG. 6 is a conceptual diagram illustrating another example embodiment of the seal bolt unit shown in FIG. 4.

FIG. 6 is a conceptual diagram illustrating another example embodiment of the seal bolt unit shown in FIG. 4. FIGS. 3 and 6, the seal bolt unit 2300 may include a seal open/close unit 2310, a seal communication unit 2320, a seal antenna unit 2330, a seal battery unit 2340, and a seal coupling unit 2350.

The seal open/close unit 2310 may be coupled to the seal fastening unit 2500 and may be separated from the seal fastening unit 2500. The seal open/close unit 2310 may include a bolt head part 2311 and a bolt thread part 2312.

The seal communication unit 2320 may be located inside the bolt head part 2311. The seal communication unit 2320 may be built or inserted into the spare space of the bolt head part 2311.

The seal antenna unit 2330 may be formed inside the bolt thread part 2312. The seal antenna unit 2 may be inserted into the bolt thread part 2312 and may be integrally coupled with each other. The seal antenna unit 2330 may be connected to the seal communication unit 2320. The seal antenna unit 2330 may be in a stretched form like a string or in the form of a coil. The seal antenna unit 2330 may be connected to the seal communication unit 320 or the seal battery unit 2340, which will be described later. The seal antenna unit 2330 may be disposed in the form of a string or coil along the inside of the bolt thread part 2312.

The seal antenna unit 2330 may further include an antenna contact part 2331. The antenna contact part 2331 may be a conductive wire connected to the seal antenna unit 2330 and may be exposed to the outside through the upper part of the bolt thread part 2312.

The seal battery unit 2340 may be located inside the bolt head part 2311. The seal battery unit 2340 may be built or inserted into the spare space of the bolt head part 2311. The seal battery unit 2340 may supply power to the seal communication unit 2320 and/or the seal antenna unit 2330.

The seal coupling unit 2350 may be coupled to the top of the bolt head part 2311 and may be separated from the bolt head part 2311. The seal coupling unit 2350 may seal the electronic power meter 1100 by combining with the bolt head part 2311. Additionally, the seal coupling unit 2350 may be broken and separated from the bolt head part 2311 to release the seal of the electronic power meter 1100.

The seal coupling unit 2350 may further include a bolt contact part 2351. The bolt contact part 2351 may be a conductive wire connected to the seal communication unit 2320 and may be exposed to the outside through the bottom of the seal coupling unit 2350. When the seal coupling part 2350 is turned to the right, it may be combined with the bolt head part 2311 to seal the electronic power meter 1100.

When the seal coupling unit 2350 turns to the right, the bolt contact part 2351 may descend and contact the antenna contact part 2331. When the bolt contact part 2351 and the antenna contact part 2331 come into contact, a closed circuit may be formed in which the seal communication unit 2320, the seal antenna unit 2330, and the seal battery unit 2340 are connected. When the closed circuit is formed, the seal battery unit 2340 may supply power to the seal communication unit 2320 and/or the seal antenna unit 2330. When power is supplied to the seal communication unit 2320 and/or the seal antenna unit 2330, the seal communication unit 2320 and/or the seal antenna unit 2330 may be recognized by a device capable of wireless communication.

Accordingly, the seal bolt unit 2300 may form a closed circuit at the same time as sealing. The seal bolt unit 2300 may store the power of the seal battery unit 2340 before being sealed. The seal bolt unit 2300 may supply power when sealing is completed and may be recognized by a device capable of wireless communication.

When the seal coupling part 2350 is turned left, it may be separated from the bolt head part 2311 and the seal of the electronic power meter power meter 1100 may be released. When the seal coupling unit 2350 turns left, the bolt contact part 2351 may rise and be spaced apart from the antenna contact part 2331. When the bolt contact part 2351 and the antenna contact part 2331 are separated, the supply of power to the seal communication part 2320 and/or the seal antenna unit 2330 may be cut off. Accordingly, the supply of power to the seal bolt unit 2300 may be cut off at the same time as the seal is released, and it may be not recognized by a device capable of wireless communication.

Figure 7:
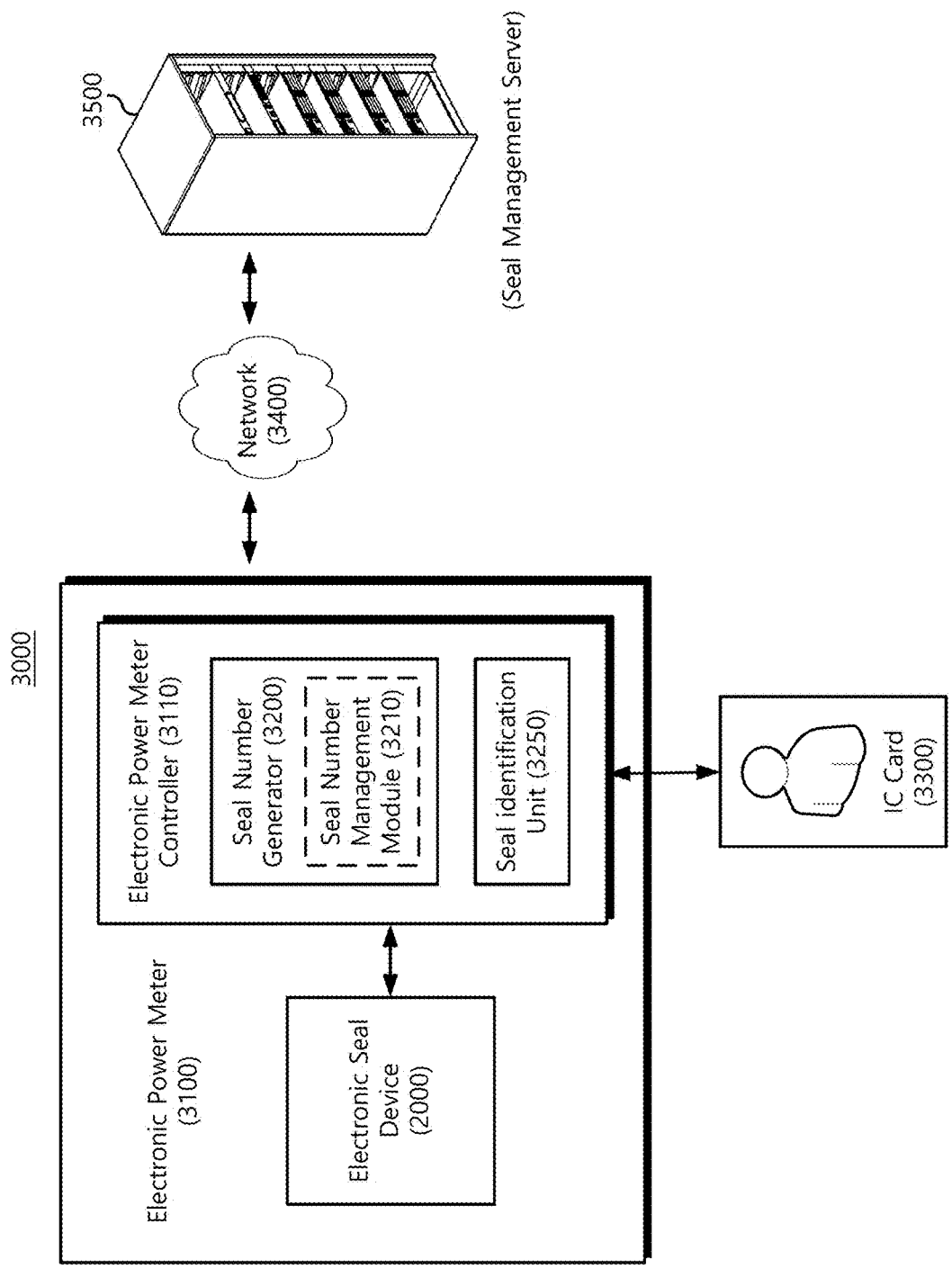
FIG. 7 is a block diagram illustrating another example embodiment of a smart electronic seal system of the present disclosure.

FIG. 7 is a block diagram illustrating another example embodiment of a smart electronic seal system of the present disclosure. Referring to FIG. 7, the smart electronic seal system 3000 may include an electronic power meter 3100, an IC card 3300, a network 3400, and a seal management server 3500. The electronic power meter 3100 may include an electronic power meter controller 3110 and an electronic seal device 2000. The electronic power meter controller 3110 may include a seal number generator 3200 and a seal identification unit 3250.

The seal number generator 3200 may include a seal number management module 3210. The seal number management module 3210 may receive a request from the IC card 3300 or from the seal management server 3500 through the network 3400 and generate a seal number. The seal number may be provided to the electronic seal device 2000 of the electronic power meter 3100.

For example, the seal number may be a 7-digit unique number. The seal number may further include seal reference information. The seal reference information may include the unique number of the electronic power meter 3100, the unique number of the seal manager, seal time information, seal type information, and seal location information.

Figure 8:
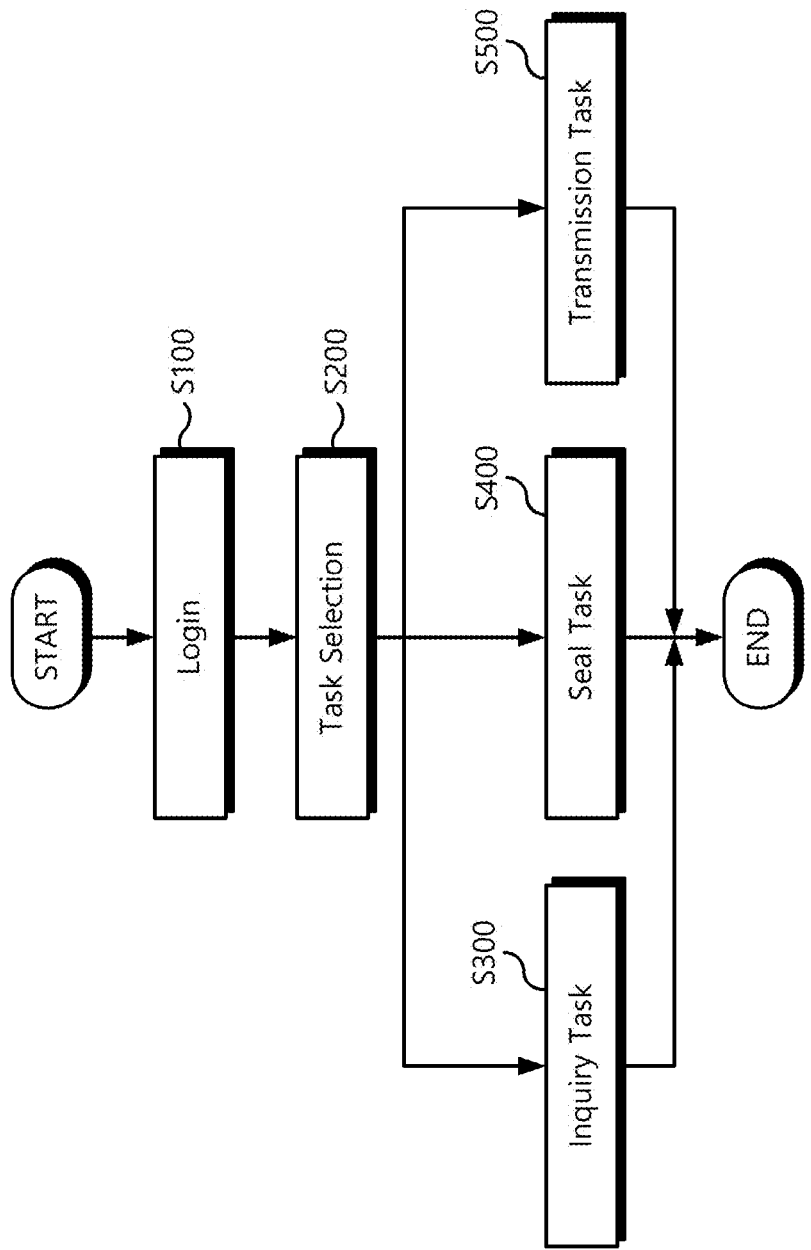
FIG. 8 is a flowchart illustrating an example embodiment of an operation method of the seal number management module shown in FIG. 7.

FIG. 8 is a flowchart illustrating an example embodiment of an operation method of the seal number management module shown in FIG. 7. Referring to FIG. 8, the operation method of the seal number management module 3210 may include login (S100), task selection (S200), inquiry task (S300), seal task (S400), and transmission task (S500).

In operation S100, the seal number management module 3210 may obtain access to the electronic seal system 3000 to perform task. In operation S200, the seal number management module 3210 may select one of an inquiry task, a seal task, and a transmission task. In operation S200, the seal number management module 3210 may provide the seal manager with options of an inquiry task, a seal task, and a transmission task.

The seal number management module 3210 may perform operation S300 when the seal manager selects an inquiry task, perform operation S400 when selecting a seal task, and may perform operation S500 when selecting a transmission task. In operation S300, the seal number management module 3210 may perform the task of querying information on the electronic power meter 3100, terminal cover, and/or auxiliary cover. In operation S400, the seal number management module 3210 may perform the task of sealing the terminal cover or auxiliary cover of the electronic power meter 3100. In operation S500, the seal number management module 3210 may perform a transmission task.

The seal number management module 3210 may terminate the task by completing the inquiry task (S300), seal task (S400), and/or transmission task (S500). The seal number management module 3210 may receive logout information from the seal manager to end task. The seal number management module 3210 may return to operation S200 when the seal manager performs additional task.

Figure 9:
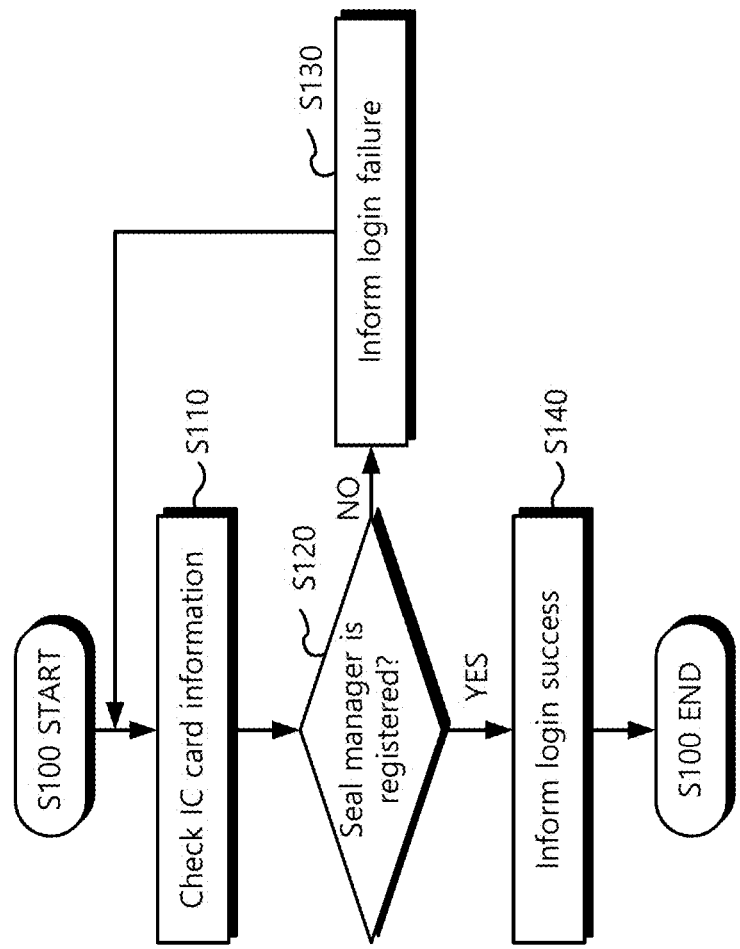
FIG. 9 is a flowchart illustrating an example embodiment of the login process shown in FIG. 8.

FIG. 9 is a flowchart illustrating an example embodiment of the login process shown in FIG. 8. Referring to FIGS. 7 and 9, the seal number management module 3210 may obtain access to the smart electronic seal system 3000 to perform seal tasks.

In operation S110, the seal number management module 3210 may check the information of the IC card 3300. The seal number management module 3210 may be connected to the IC card 3300 through NFC communication or RFID communication to exchange data. The seal number management module 3210 may obtain the unique number of the seal manager from the IC card 3300. The seal number management module 3210 may transmit the unique number of the seal manager to the seal management server 3500.

In operation S120, the seal number management module 3210 may query whether the unique number of the seal manager is registered in the seal management server 3500. The seal number management module 3210 may receive a query result from the seal management server 3500. As an example, the query result may include registered state information or unregistered state information.

If the seal manager is not registered, the seal number management module 3210 may not recognize the information on the IC card 3300 and thus may inform the seal manager of a login failure (S130). If the seal manager is registered, the seal number management module 3210 may inform the seal manager of a login success (S140).

Figure 10:
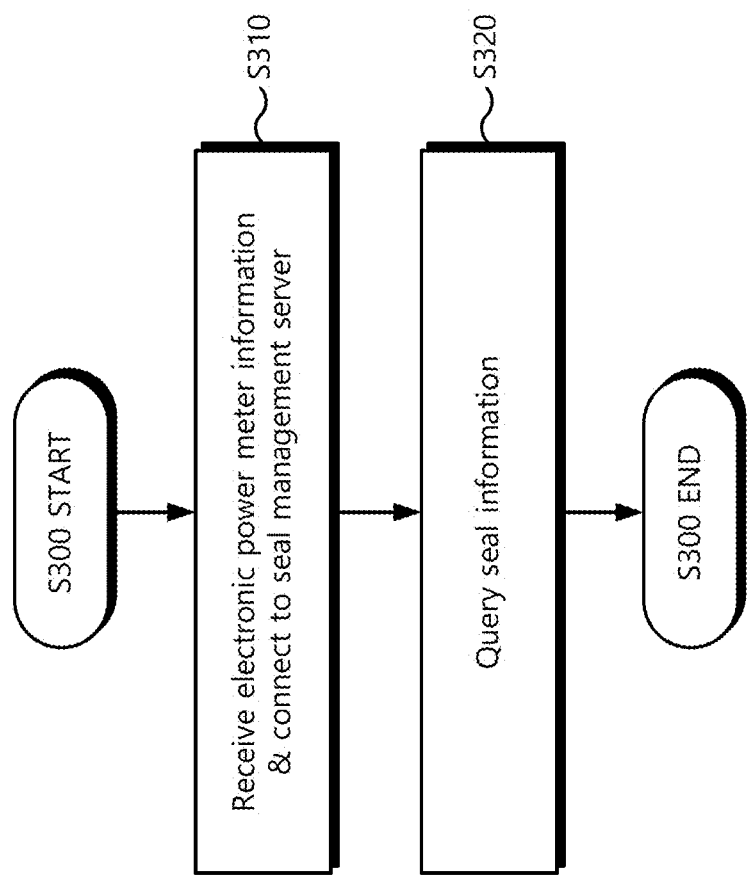
FIG. 10 is a flowchart illustrating an example embodiment of the inquiry task shown in FIG. 8.

FIG. 10 is a flowchart illustrating an example embodiment of the inquiry task shown in FIG. 8. Referring to FIG. 10, the seal number management module 3210 may perform the task of querying information on the electronic power meter 3100, terminal cover, or auxiliary cover.

In operation S310, the seal number management module 3210 may receive information on the electronic power meter 3100 and may be wirelessly connected to the seal management server 3500 through the network 3400 using the input electronic power meter information. The detailed method of operation S310 will be described below with reference to FIG. 11.

In operation S320, the seal number management module 3210 may query seal information from the seal management server 3500. The detailed method of operation S320 will be described below with reference to FIG. 12.

Figure 11:
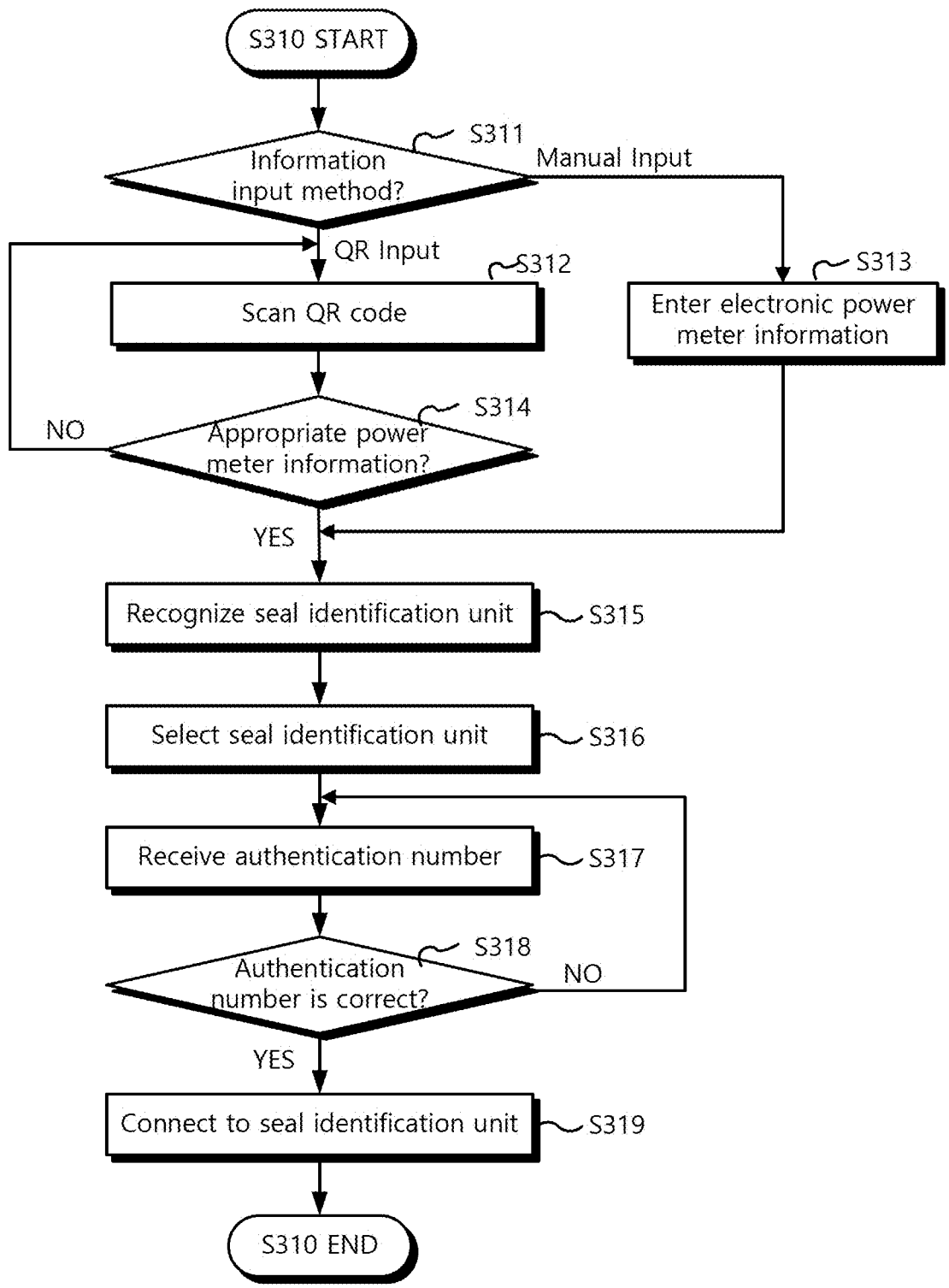
FIG. 11 is a flowchart illustrating an example embodiment of the input of the electronic power meter information and connection to the seal management server shown in FIG. 10.

FIG. 11 is a flowchart illustrating an example embodiment of the input of the electronic power meter information and connection to the seal management server shown in FIG. 10. Referring to FIGS. 7 and 11, the seal number management module 3210 may receive information on the electronic power meter 3100 and may connect to the seal management server 3500 through wireless communication using the input electronic power meter information.

In operation S311, the seal number management module 3210 may allow the seal manager to select an information input method. As an example, the information input method may include QR input and/or manual input. The seal manager may select the information input method through QR (QR input). The seal number management module 3210 may prepare for QR code scanning (S312). The seal manager may select a manual input method (manual input). The seal number management module 3210 may provide a screen for entering information to the seal manager (S313).

In operation S312, the seal number management module 3210 may scan a QR code using an image recognition device. As an example, the image recognition device may be a QR code reader or a camera. The image recognition device may scan a QR code outside the electronic power meter 3100. The seal number management module 3210 may obtain the unique number of the electronic power meter 3100 by decoding the QR code.

In operation S313, the seal number management module 3210 may receive the unique number of the electronic power meter 3100 from the seal manager. The seal number management module 3210 may perform a process to recognize the seal identification unit 3250 through the seal management server 3500 (S315). The seal identification unit 3250 may be attached to the electronic power meter 3100. The seal identification unit 3250 may identify the open or close state of the terminal cover and/or auxiliary cover of the electronic power meter 3100 and generate seal identification information.

In operation S314, the seal number management module 3210 may determine whether the electronic power meter information is appropriate using the unique number of the electronic power meter 3100 scanned in operation S312. If the information of the electronic power meter 3100 is appropriate (YES), the seal number management module 3210 may perform a process to recognize the seal identification unit 3250 through the seal management server 3500 (S315). If the information of the electronic power meter 3100 is not appropriate (NO), the seal number management module 3210 may scan the QR code again to obtain the unique number of the appropriate electronic power meter information (S312).

In operation S315, the seal number management module 3210 may recognize the seal identification unit 3250 through the seal management server 3500. As an example, at least one seal identification unit 3250 recognized by the seal number management module 3210 may be included. The seal number management module 3210 may provide information about at least one seal identification unit 3250 to the seal manager.

In operation S316, the seal number management module 3210 may provide at least one seal identification unit 3250 in the form of a list to the seal manager. When the seal manager may select one of the seal identification units 3250, the seal number management module 3210 may recognize the selected seal identification unit 3250.

In operation S317, the seal number management module 3210 may request an authentication number from the seal manager. The seal number management module 3210 may receive an authentication number from the seal manager.

In operation S318, the seal number management module 3210 may determine whether the authentication number input from the seal identification unit 3250 is correct. The seal number management module 3210 may receive a unique authentication number from the selected seal identification unit 3250. The seal number management module 3210 may compare the unique authentication number of the selected seal identification unit 3250 with the authentication number input from the seal manager. If the two numbers match, the seal number management module 3210 may determine it to be the correct authentication number. If the two numbers do not match, the seal number management module 3210 may determine that the authentication number is incorrect and request the authentication number again (S317).

In operation S319, the seal number management module 3210 may be connected to the seal identification unit 3250 using wireless short-range communication. As an example, short-range wireless communication may include a bluetooth communication method.

Figure 12:
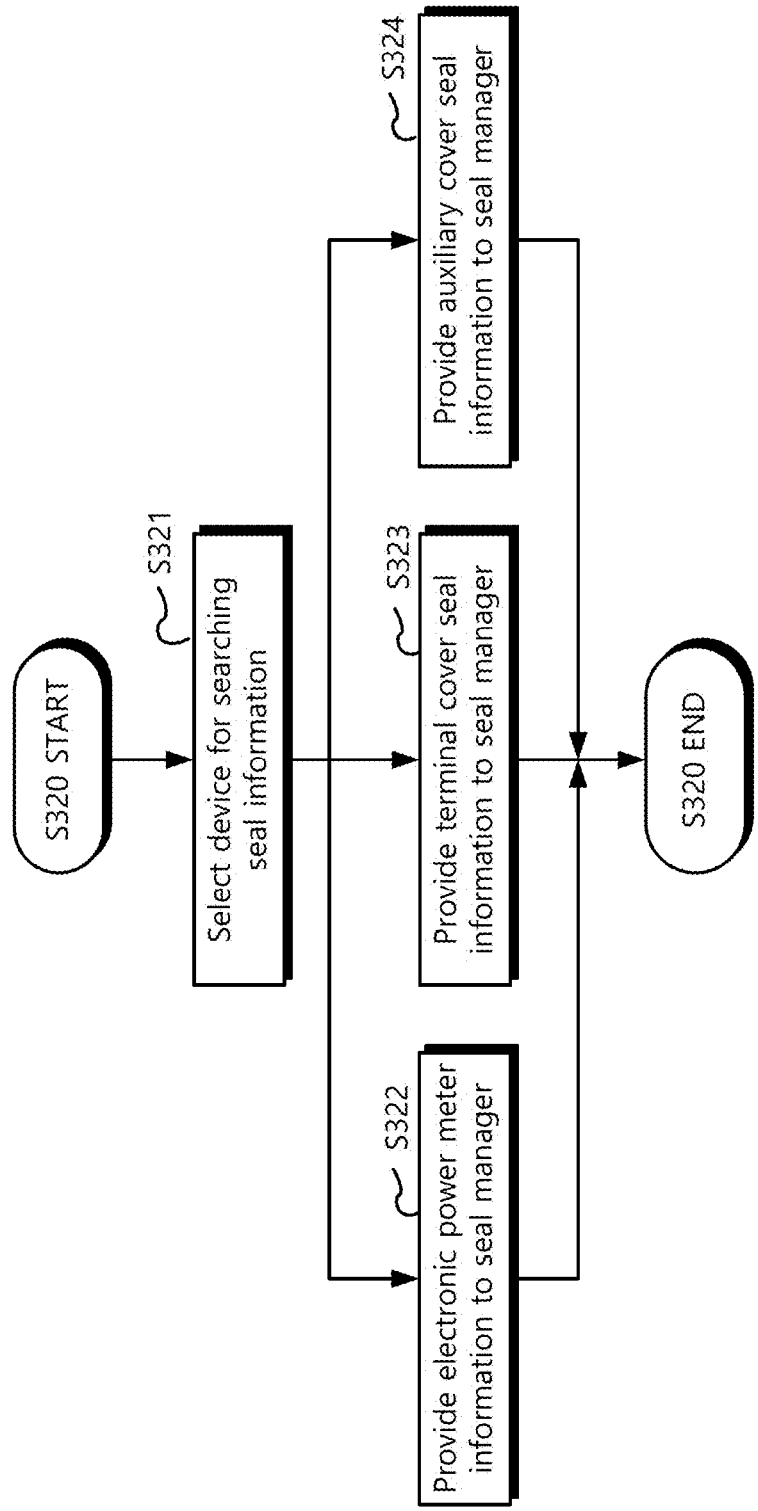
FIG. 12 is a flowchart illustrating an example embodiment of the operation S320 'query seal information' shown in FIG. 10.

FIG. 12 is a flowchart illustrating an example embodiment of the operation S320 'query seal information' shown in FIG. 10. Referring to FIGS. 7 and 12, the seal number management module 3210 may query seal information from the seal management server 3500 connected through the network 3400.

In operation S321, the seal number management module 3210 may select a device for searching seal information. As an example, the device subject to inquiry may include an electronic power meter 3100, a terminal cover, and/or an auxiliary cover. The seal number management module 3210 may provide a list of devices subject to inquiry to the seal manager. The seal number management module 3210 may receive selection results from the seal manager.

The seal number management module 3210 may perform operation S322 when the electronic power meter 3100 is selected. The seal number management module 3210 may perform operation S323 when a terminal cover is selected. The seal number management module 3210 may perform operation S324 when the auxiliary cover is selected.

In operation S322, the seal number management module 3210 may provide information about the electronic power meter 3100 to the seal manager when the electronic power meter 3100 is selected. As an example, information about the electronic power meter 3100 may include the manufacturer, the unique number of the electronic power meter 3100, the date of manufacture, and the manufacturing number.

In operation S323, when a terminal cover is selected, the seal number management module 3210 may provide information related to the seal of the terminal cover to the seal manager. Information related to the seal of the terminal cover may include the current seal number, current seal state, date of most recent state change, and person in charge of most recent seal state change.

In operation S324, when the auxiliary cover is selected, the seal number management module 3210 may provide information related to the seal of the auxiliary cover to the seal manager. Information related to the seal of the auxiliary cover may include the current seal number, current seal state, date of most recent change in state, and person in charge of recent change in seal state.

Figure 13:
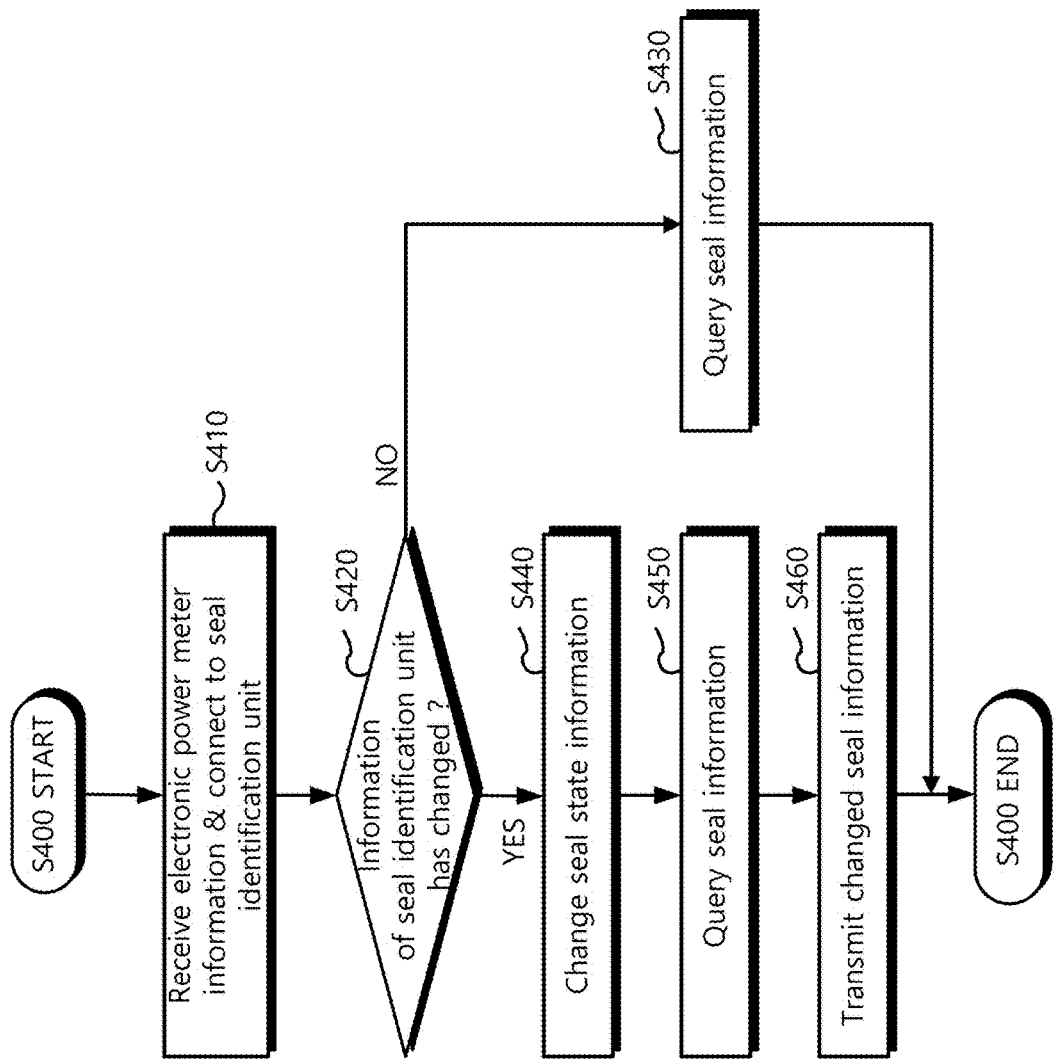
FIG. 13 is a flowchart illustrating an example embodiment of the seal task shown in FIG. 8.

FIG. 13 is a flowchart illustrating an example embodiment of the seal task shown in FIG. 8. Referring to FIGS. 7 and 13, the seal number management module 3210 may perform the seal task of the terminal cover and/or auxiliary cover of the electronic power meter 3100.

In operation S410, the seal number management module 3210 may receive information on the electronic power meter 3100 and connect the seal identification unit 3250 in the same manner as operation S310 described in FIGS. 10 and 11.

In operation S420, the seal number management module 3210 may determine whether the information of the seal identification unit 3250 has changed. The information of the seal identification unit 3250 may include information about the seal state of the terminal cover and/or the auxiliary cover. As an example, information about the seal state may include whether the current seal state is open or closed. The seal state information of the seal identification unit 3250 may be closed during sealing, and open when the seal is released. When sealing is completed again, the seal state information of the seal identification unit 3250 may be changed to closed.

If the seal number management module 3210 determines that the information of the seal identification unit 3250 has not changed (NO), it may perform operation S430 to query the seal information. If the seal number management module 3210 determines that the information of the seal identification unit 3250 has changed (YES), it may perform operation S440 to change the seal information.

In operation S430, the seal number management module 3210 may query seal information. The seal number management module 3210 may query information in the same manner as operation S320 described in FIGS. 10 and 12.

In operation S440, the seal number management module 3210 may change and manage seal state information. As an example, the seal state information may include the current seal number of the terminal cover and/or auxiliary cover, current seal state (OPEN/CLOSE), date of most recent seal state change, and information on the person responsible for the most recent seal state change.

In operation S450, the seal number management module 3210 may query seal information. The seal number management module 3210 may query information in the same manner as operation S320 described in FIGS. 10 and 12.

In operation S460, the seal number management module 3210 may transmit the changed seal information to the seal management server 3500. The seal management server 3500 may store and manage the changed seal information.

Figure 14:
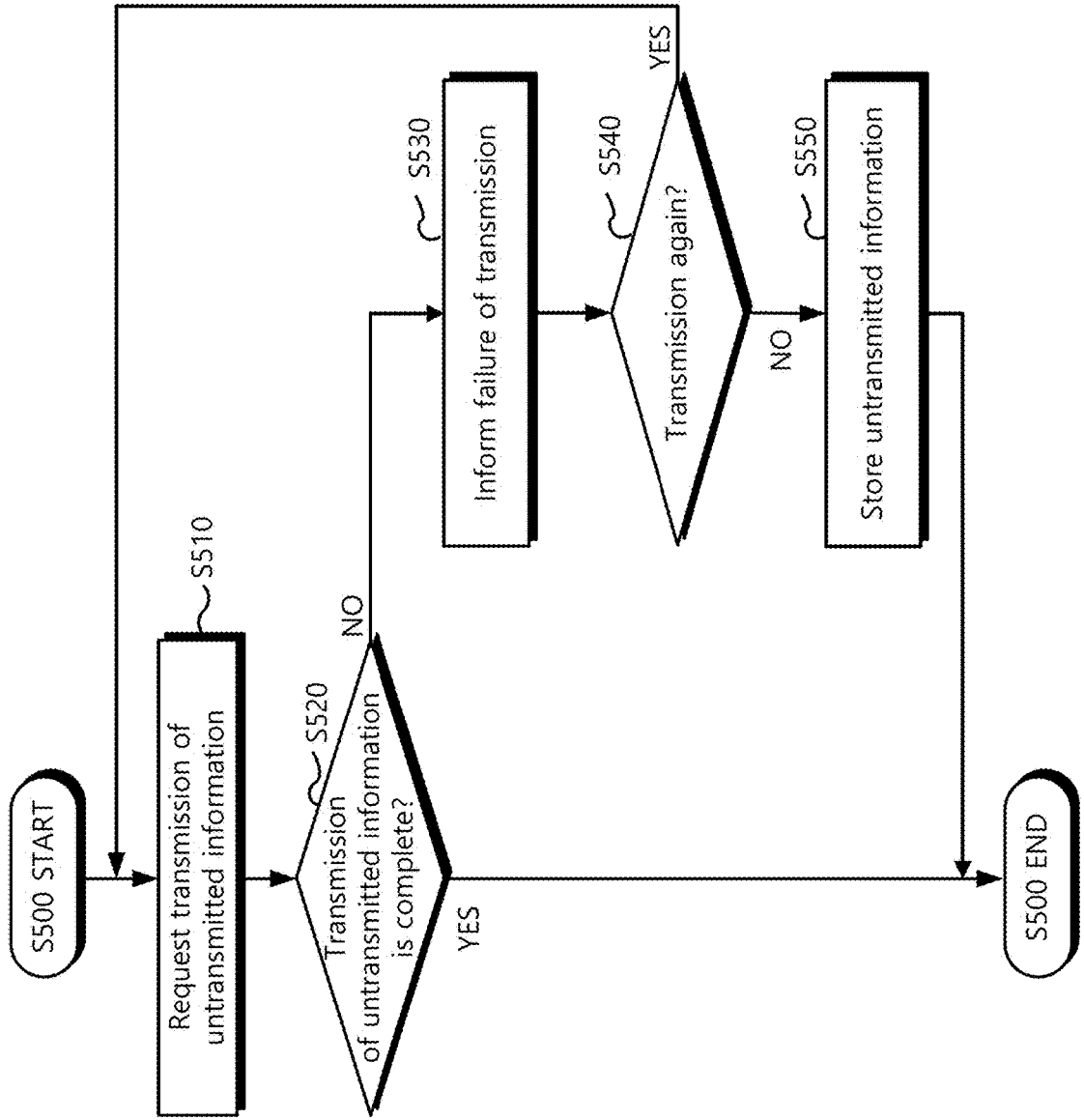
FIG. 14 is a flowchart illustrating an example embodiment of the transmission task shown in FIG. 8.

FIG. 14 is a flowchart illustrating an example embodiment of the transmission task shown in FIG. 8. FIGS. 7 and 14, the seal number management module 3210 may perform the task of transmitting information that has not yet been transmitted (hereinafter referred to as untransmitted information).

The untransmitted information may include information that the seal number management module 3210 needs to update for the electronic power meter 3100, terminal cover, and/or auxiliary cover, but has not transmitted to the seal management server 3500. The seal number management module 3210 may perform the task of transmitting untransmitted information regardless of the inquiry task (S300) or the seal task (S400).

The seal number management module 3210 may repeatedly perform the task of transmitting untransmitted information. When a situation occurs in which the seal number management module 3210 is disconnected from the network 3400 and reconnected, the seal number management module 3210 may automatically transmit untransmitted information to the seal management server 3500.

In operation S510, the seal number management module 3210 may directly perform a request for transmission of untransmitted information or may receive a request from the seal manager.

In operation S520, the seal number management module 3210 may transmit untransmitted information to the seal management server 3500 and determine whether transmission is complete. If the seal number management module 3210 determines that transmission has been completed (YES), it may complete the task of transmitting untransmitted information.

In operation S530, if the seal number management module 3210 determines that the transmission has not been completed (NO), it may inform the seal manager that the transmission of the untransmitted information has failed.

In operation S540, the seal number management module 3210 may determine whether to transmit again or receive input. If the seal number management module 3210 determines to retransmit the untransmitted information (YES), it may request transmission of the untransmitted information (S510).

In operation S550, if the seal number management module 3210 determines not to transmit the untransmitted information again (NO), the untransmitted information may be stored in the internal storage space of the seal number management module 3210 and the task may be completed.

FIG. 15 is a block diagram illustrating another example embodiment of a smart electronic seal system according to the present disclosure. The smart electronic seal system 4000 shown in FIG. 15 may have the same construction principle and operation as the smart electronic seal system 3000 shown in FIG. 7, except that the electronic power meter controller 4110 is outside the electronic power meter 4100.

Referring to FIG. 15, the smart electronic seal system 4000 may include an electronic power meter 4100, the electronic power meter controller 4110, an IC card 4300, a network 4400, and a seal management server 4500. The electronic power meter 4100 may include an electronic seal device 2000. The electronic power meter controller 4110 may include a seal number generator 4200 and a seal identification unit 4250.

The seal number generator 4200 may include a seal number management module 4210. The seal number management module 4210 may receive a request from the IC card 4300 or from the seal management server 4500 through the network 4400 and generate a seal number. The seal number may be provided to the electronic seal device 2000 of the electronic power meter 4100. For example, the seal number may be a 7-digit unique number. The seal number may further include seal reference information. The seal reference information may include the unique number of the electronic power meter 4100, the unique number of the seal manager, seal type information, and/or seal location information.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. The electronic seal device comprising:
a seal bolt unit for electronic sealing; and
a seal fastening unit coupled to the seal bolt unit using a screw thread,
wherein the seal bolt unit comprises,
a seal open/close unit coupled to the seal fastening unit using the screw thread;
a seal communication unit located inside the upper part of the seal open/close unit; and
a sealed antenna unit located inside the lower part of the seal open/close unit,
wherein the seal antenna unit comprises,
a first conductor part connected to the seal communication unit;
a first contact part connected to the first conductor part;
a second conductor part connected to a seal battery unit;
a second contact part connected to the second conductor part; and
an insulating part located between the first contact part and the second contact part, and
wherein the first contact part and the second contact part are electrically connected when the seal fastening unit and the seal open/close unit are coupled.

2. The electronic seal device of claim 1,
wherein the seal open/close unit comprises,
a bolt head part located above the seal open/close unit and including a driver groove at the top; and
a bolt thread part located below the seal open/close unit and including the screw thread on the outside.

3. The electronic seal device of claim 2,
wherein the bolt communication unit is located inside the bolt head part, and
wherein the seal antenna unit is located inside the bolt thread part.

4. The electronic seal device of claim 1,
wherein the seal battery unit is included in the seal bolt unit, and supplies power to the seal communication unit and the seal antenna unit.

5. The electronic seal device of claim 4,
wherein the seal battery unit is connected to the seal antenna unit with a (+) pole and is connected to the seal communication unit with a (−) pole, or
wherein the seal battery unit is connected to the seal antenna unit with a (−) pole and is connected to the seal communication unit with a (+) pole.

6. The smart electronic seal system comprising:
an electronic power meter including an electronic seal device and an electronic power meter controller; and
a seal number generator for providing a seal number to the electronic seal device,
wherein the electronic power meter controller receives a seal number from the seal number generator and controls the seal operation of the electronic seal device, and
wherein the electronic seal device comprises,
a seal bolt unit for electronic sealing; and
a seal fastening unit coupled to the seal bolt unit,
wherein the seal bolt unit comprises,
a seal open/close unit coupled to the seal fastening unit;
a seal communication unit located inside the upper part of the seal open/close unit; and
a seal antenna unit located inside the lower part of the seal open/close unit,
wherein the seal antenna unit comprises,
a first conductor part connected to the seal communication unit;
a first contact part connected to the first conductor part;
a second conductor part connected to a seal battery;
a second contact part connected to the second conductor part; and
an insulating part located between the first contact part and the second contact part, wherein the first contact part and the second contact part are electrically connected when the seal fastening unit and the seal open/close unit are coupled.

7. The smart electronic seal system of claim 6,
wherein the electronic power meter controller comprises,
a seal control unit configured to determine a state of the electronic power meter and generate power meter state information; and
a seal display unit configured to display power meter state information generated by the seal control unit.

8. The smart electronic seal system of claim 7,
wherein the power meter state information includes total power consumption, power consumption by time zone, piece time, active power, reactive power, regular load active power, late-night load active power, and current time information.

9. The smart electronic seal system of claim 7,
wherein the seal control unit receives a seal number from the seal number generator and generates a power meter seal number, and the power meter seal number is stored in electronic form.

10. The smart electronic seal system of claim 7,
wherein the seal control unit is configured to determine whether the seal is open state or close state, and generate power meter seal information; and
wherein the seal control unit is configured to generate seal completion information when the seal is completed, and generate seal release information when the seal is broken.

11. The smart electronic seal system comprising:
an electronic power meter including an electronic seal device; and
an electronic power meter controller configured to include a seal number generator for providing a seal number to the electronic seal device and control a seal operation of the electronic seal device,
wherein the electronic seal device comprises,
a seal bolt unit for electronic sealing; and
a seal fastening unit coupled to the seal bolt unit,
wherein the seal bolt unit comprises,
a seal open/close unit coupled to the seal fastening unit;
a seal communication unit located inside the upper part of the seal open/close unit; and
a seal antenna unit located inside the lower part of the seal open/close unit,
wherein the seal antenna unit comprises,
a first conductor part connected to the seal communication unit;
a first contact part connected to the first conductor part;
a second conductor part connected to a seal battery;
a second contact part connected to the second conductor part; and
an insulating part located between the first contact part and the second contact part,
wherein the first contact part and the second contact part are electrically connected when the seal fastening unit and the seal open/close unit are coupled.

12. The smart electronic seal system of claim 11,
wherein the electronic power meter controller comprises,
a seal control unit configured to determine a state of the electronic power meter and generate power meter state information; and
a seal display unit configured to display power meter state information generated by the seal control unit.

13. The smart electronic seal system of claim 12,
wherein the power meter state information includes total power consumption, power consumption by time zone, piece time, active power, reactive power, regular load active power, late-night load active power, and current time information.

14. The smart electronic seal system of claim 12,
wherein the seal control unit receives a seal number from the seal number generator and generates a power meter seal number, and the power meter seal number is stored in electronic form.

15. The smart electronic seal system of claim 12,
wherein the seal control unit is configured to determine whether the seal is open state or close state, and generate power meter seal information; and
wherein the seal control unit is configured to generate seal completion information when the seal is completed, and generate seal release information when the seal is broken.

* * * * *